(12) United States Patent
Ueda et al.

(10) Patent No.: US 11,145,429 B2
(45) Date of Patent: Oct. 12, 2021

(54) EXTREME ULTRAVIOLET CHAMBER APPARATUS, EXTREME ULTRAVIOLET LIGHT GENERATION SYSTEM, AND METHOD FOR MANUFACTURING ELECTRONIC DEVICE

(71) Applicant: Gigaphoton Inc., Tochigi (JP)

(72) Inventors: Atsushi Ueda, Oyama (JP); Gota Niimi, Oyama (JP); Georg Soumagne, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 16/820,849

(22) Filed: Mar. 17, 2020

(65) Prior Publication Data

US 2020/0312479 A1 Oct. 1, 2020

(30) Foreign Application Priority Data

Apr. 1, 2019 (JP) ............................. JP2019-070021

(51) Int. Cl.
*G21K 1/06* (2006.01)
*G02B 5/08* (2006.01)
*G02B 5/10* (2006.01)
*H05G 2/00* (2006.01)
(Continued)

(52) U.S. Cl.
CPC .............. *G21K 1/06* (2013.01); *G02B 5/0891* (2013.01); *G02B 5/10* (2013.01); *G02B 27/0006* (2013.01); *G03F 7/70166* (2013.01); *H05G 2/005* (2013.01); *H05G 2/006* (2013.01);
(Continued)

(58) Field of Classification Search
CPC ............... G21K 1/06; G21K 2201/064; G21K 2201/065; G02B 5/0891; G02B 5/10; G02B 27/0006; G03F 7/70175; G03F 7/70916; G03F 7/70033; G03F 7/70933;
(Continued)

(56) References Cited

U.S. PATENT DOCUMENTS

2009/0250641 A1\* 10/2009 Moriya ............... G03F 7/70916
250/504 R
2014/0306115 A1 10/2014 Kuritsyn et al.
2016/0143122 A1 5/2016 Heo et al.
(Continued)

FOREIGN PATENT DOCUMENTS

WO 2009025557 A1 2/2009
WO 2018127565 A2 7/2018
WO 2018/211569 A1 11/2018

OTHER PUBLICATIONS

A Search Report issued by the Netherlands Patent Office dated Oct. 5, 2020, which corresponds to Dutch Patent Application No. 2025184 and is related to U.S. Appl. No. 16/820,849; with partial English language explanation.

*Primary Examiner* — Kiet T Nguyen
(74) *Attorney, Agent, or Firm* — Studebaker & Brackett PC

(57) ABSTRACT

An extreme ultraviolet chamber apparatus includes: a chamber; an EUV condensing mirror arranged in the chamber; a first nozzle arranged in an outer peripheral portion of the EUV condensing mirror and configured to feed a gas in a first direction along a reflective surface of the EUV condensing mirror; a second nozzle arranged in the outer peripheral portion of the EUV condensing mirror and configured to feed a gas in a second direction away from the EUV condensing mirror; and an exhaust port arranged in the chamber.

20 Claims, 16 Drawing Sheets

(51) Int. Cl.
 *G02B 27/00* (2006.01)
 *G03F 7/20* (2006.01)
(52) U.S. Cl.
 CPC ....... *H05G 2/008* (2013.01); *G21K 2201/064* (2013.01); *G21K 2201/065* (2013.01)
(58) Field of Classification Search
 CPC .... G03F 7/70166; H05G 2/006; H05G 2/008; H05G 2/003; H05G 2/005
 USPC ...................................................... 250/504 R
 See application file for complete search history.

(56) References Cited

U.S. PATENT DOCUMENTS

| | | |
|---|---|---|
| 2018/0173117 A1* | 6/2018 | Chien ................. G03F 7/70175 |
| 2018/0224748 A1 | 8/2018 | Nagai et al. |
| 2020/0033739 A1* | 1/2020 | Hori ................... G03F 7/70916 |
| 2020/0041909 A1 | 2/2020 | Ueda |
| 2020/0089124 A1* | 3/2020 | Labetski ................ H05G 2/008 |

* cited by examiner

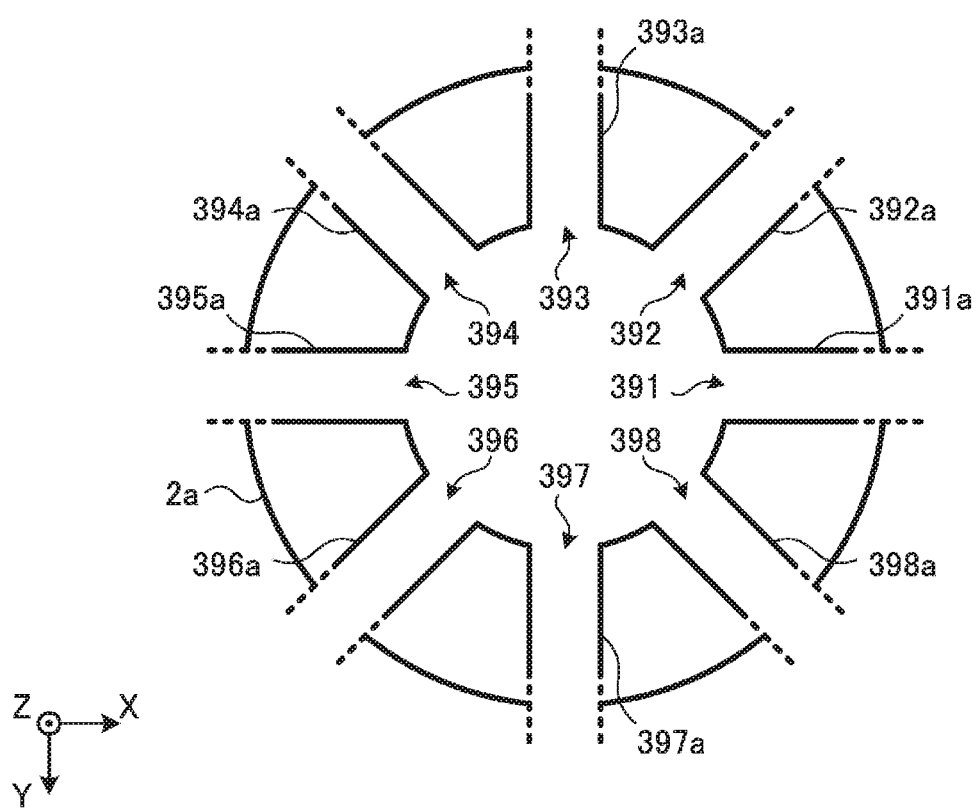

EXTREME ULTRAVIOLET CHAMBER APPARATUS, EXTREME ULTRAVIOLET LIGHT GENERATION SYSTEM, AND METHOD FOR MANUFACTURING ELECTRONIC DEVICE

CROSS-REFERENCE TO RELATED APPLICATIONS

This application claims the benefit of Japanese Patent Application No. 2019-070021, filed on Apr. 1, 2019, the entire contents of which are hereby incorporated by reference.

BACKGROUND

1. Technical Field

The present disclosure relates to an extreme ultraviolet chamber apparatus, an extreme ultraviolet light generation system, and a method for manufacturing an electronic device.

2. Related Art

Recently, miniaturization of semiconductor processes has involved rapidly increasing miniaturization of transfer patterns for use in photolithography of the semiconductor processes. In the next generation, microfabrication at 70 nm to 45 nm and further microfabrication at 32 nm or less will be required. Thus, to satisfy the requirement for the microfabrication, for example, at 32 nm or less, development of an exposure device is expected including a combination of an extreme ultraviolet light generation apparatus configured to generate extreme ultraviolet (EUV) light having a wavelength of about 13 nm and reduced projection reflection optics.

Three types of EUV light generation apparatuses have been proposed: an LPP (Laser Produced Plasma) type apparatus using plasma generated by irradiating a target substance with a pulse laser beam, a DPP (Discharge Produced Plasma) type apparatus using plasma generated by discharge, and an SR (Synchrotron Radiation) type apparatus using synchrotron radiation.

LIST OF DOCUMENTS

Patent Documents

Patent Document 1: International Patent Publication No. 2009/025557
Patent Document 2: US Published Patent Application No. 2018/0224748
Patent Document 3: International Patent Publication No. 2018/127565

SUMMARY

An extreme ultraviolet chamber apparatus according to an aspect of the present disclosure includes: a chamber; an EUV condensing mirror arranged in the chamber; a first nozzle arranged in an outer peripheral portion of the EUV condensing mirror and configured to feed a gas in a first direction along a reflective surface of the EUV condensing mirror; a second nozzle arranged in the outer peripheral portion of the EUV condensing mirror and configured to feed a gas in a second direction away from the EUV condensing mirror; and an exhaust port arranged in the chamber.

An extreme ultraviolet light generation system according to an aspect of the present disclosure includes: a chamber; a target supply unit configured to output a target toward a predetermined region in the chamber; a laser device configured to irradiate the target with a pulse laser beam to turn the target into plasma; an EUV condensing mirror arranged in the chamber; a first nozzle arranged in an outer peripheral portion of the EUV condensing mirror and configured to feed a gas in a first direction along a reflective surface of the EUV condensing mirror; a second nozzle arranged in the outer peripheral portion of the EUV condensing mirror and configured to feed a gas in a second direction away from the EUV condensing mirror; and an exhaust port arranged in the chamber.

A method for manufacturing an electronic device according to an aspect of the present disclosure includes: irradiating a target with a pulse laser beam to generate extreme ultraviolet light in an extreme ultraviolet light generation system including a chamber, a target supply unit configured to output the target toward a predetermined region in the chamber, a laser device configured to irradiate the target with the pulse laser beam to turn the target into plasma, an EUV condensing mirror arranged in the chamber, a first nozzle arranged in an outer peripheral portion of the EUV condensing mirror and configured to feed a gas in a first direction along a reflective surface of the EUV condensing mirror, a second nozzle arranged in the outer peripheral portion of the EUV condensing mirror and configured to feed a gas in a second direction away from the EUV condensing mirror, and an exhaust port arranged in the chamber; outputting the extreme ultraviolet light to an exposure device; and exposing a photosensitive substrate to the extreme ultraviolet light in the exposure device to manufacture an electronic device.

BRIEF DESCRIPTION OF THE DRAWINGS

With reference to the accompanying drawings, some embodiments of the present disclosure will be described below merely by way of example.

FIG. 15B is a sectional view taken along the line XVB-XVB in FIG. 15A.

DESCRIPTION OF EMBODIMENTS

Figure 1:
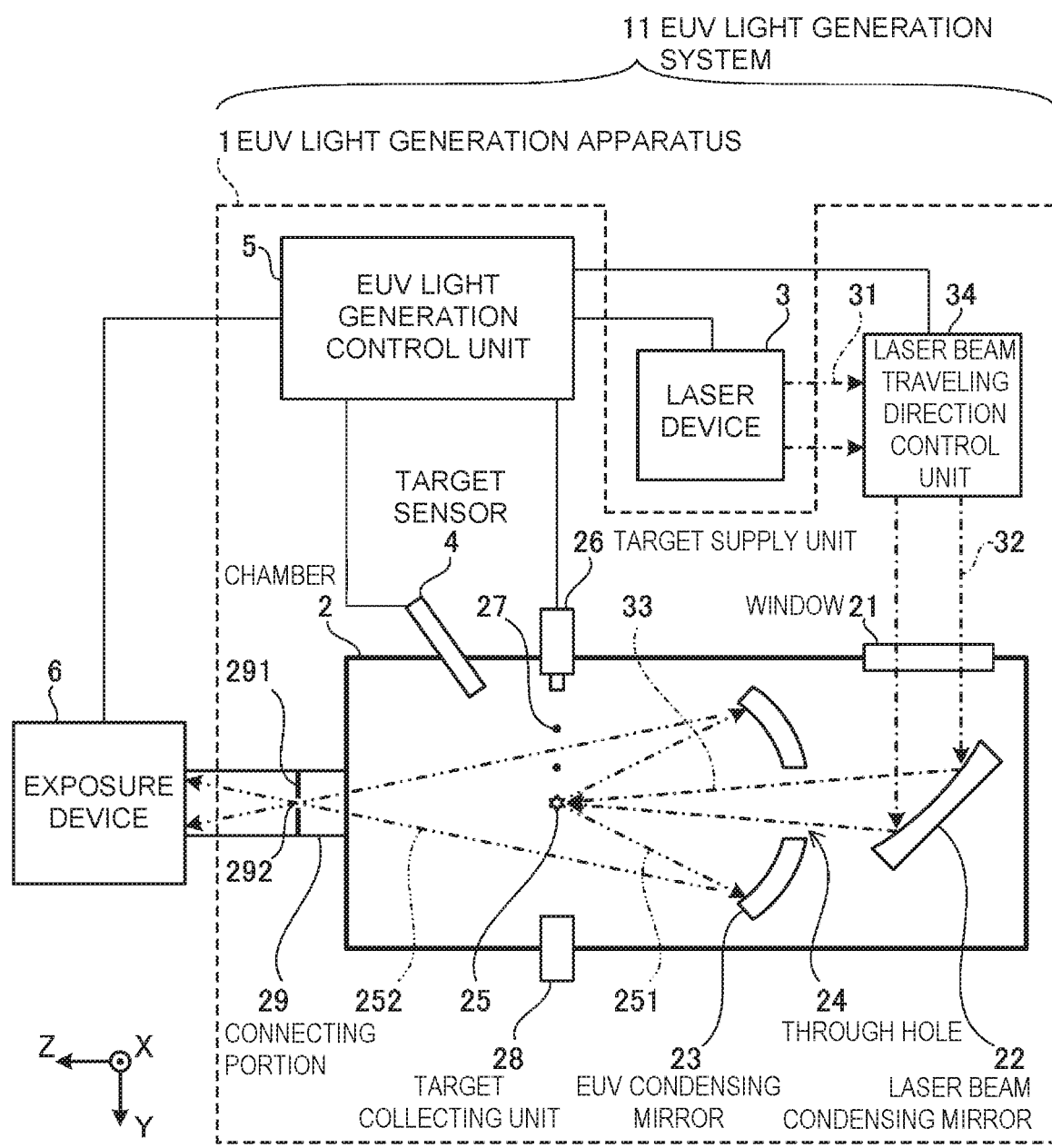
FIG. 1 schematically shows a configuration of an exemplary LPP type EUV light generation system 11.

<Contents>
1. General description of extreme ultraviolet light generation system
    1.1 Configuration
    1.2 Operation
2. Extreme ultraviolet chamber apparatus according to comparative example
    2.1 Configuration
    2.2 Operation
    2.3 Problem
3. Extreme ultraviolet chamber apparatus configured to feed gas in second and third directions from outer peripheral portion of EUV condensing mirror
    3.1 Configuration
    3.2 Operation and effect
4. Extreme ultraviolet chamber apparatus including second nozzle into which third nozzle is integrated
5. Extreme ultraviolet chamber apparatus including cooling mechanism
    5.1 Configuration
    5.2 Operation and effect
6. Details of nozzle
    6.1 Orientation of nozzle
    6.2 Configuration of nozzle opening
        6.2.1 First example
        6.2.2 Second example
        6.2.3 Third example
        6.2.4 Fourth example
        6.2.5 Fifth example
        6.2.6 Sixth example
        6.2.7 Seventh example
7. Variant of exhaust port
    7.1 First variant
    7.2 Second variant
    7.3 Third variant
8. Others Now, with reference to the drawings, embodiments of the present disclosure will be described in detail. The embodiments described below illustrate some examples of the present disclosure, and do not limit contents of the present disclosure. Also, all configurations and operations described in the embodiments are not necessarily essential as configurations and operations of the present disclosure. Like components are denoted by like reference characters, and overlapping descriptions are omitted.

1. General Description of Extreme Ultraviolet Light Generation System
    1.1 Configuration FIG. 1 schematically shows a configuration of an exemplary LPP type EUV light generation system 11. An EUV light generation apparatus 1 is used together with at least one laser device 3. In this application, a system including the EUV light generation apparatus 1 and the laser device 3 is referred to as an EUV light generation system 11. As shown in FIG. 1 and described below in detail, the EUV light generation apparatus 1 includes a chamber 2 and a target supply unit 26. The chamber 2 is configured to be sealable. The target supply unit 26 is mounted, for example, to extend through a wall of the chamber 2. A material of a target substance output from the target supply unit 26 includes tin. The material of the target substance may also include a combination of tin with terbium, gadolinium, lithium, or xenon.

The wall of the chamber 2 has at least one through hole. A window 21 is provided in the through hole. A pulse laser beam 32 output from the laser device 3 passes through the window 21. In the chamber 2, an EUV condensing mirror 23 having, for example, a spheroidal reflective surface is arranged. The EUV condensing mirror 23 has first and second focal points. On a surface of the EUV condensing mirror 23, a multilayer reflective film including, for example, alternately stacked molybdenum and silicon is formed. The EUV condensing mirror 23 is arranged so that, for example, the first focal point is located in a plasma generation region 25 and the second focal point is located in an intermediate focal (IF) point 292. A through hole 24 is provided in a center of the EUV condensing mirror 23. A pulse laser beam 33 passes through the through hole 24.

The EUV light generation apparatus 1 includes an EUV light generation control unit 5, a target sensor 4, and the like. The target sensor 4 has an imaging function, and is configured to detect presence, a trajectory, a position, a speed, or the like of a target 27.

The EUV light generation apparatus 1 includes a connecting portion 29 configured to provide communication between an interior of the chamber 2 and an interior of an exposure device 6. In the connecting portion 29, a wall 291 having an aperture is provided. The wall 291 is arranged so that the aperture is located in a position of the second focal point of the EUV condensing mirror 23.

Further, the EUV light generation apparatus 1 includes a laser beam traveling direction control unit 34, a laser beam condensing mirror 22, a target collecting unit 28 for collecting the target 27, and the like. The laser beam traveling direction control unit 34 includes an optical element for defining a traveling direction of a laser beam, and an actuator for adjusting a position, an orientation, or the like of the optical element.

1.2 Operation

With reference to FIG. 1, a pulse laser beam 31 output from the laser device 3 passes through the laser beam traveling direction control unit 34 and passes through the window 21 as the pulse laser beam 32, which enters the chamber 2. The pulse laser beam 32 travels along at least one laser beam path in the chamber 2, is reflected by the laser beam condensing mirror 22, and is applied as the pulse laser beam 33 to at least one target 27.

The target supply unit 26 outputs the target 27 toward the plasma generation region 25 in the chamber 2. The target 27 is irradiated with at least one pulse included in the pulse laser beam 33. The target 27 irradiated with the pulse laser beam is turned into plasma, and radiation light 251 is radiated from the plasma. The EUV condensing mirror 23 reflects EUV light included in the radiation light 251 with higher reflectance than light in a different wavelength range. Reflected light 252 including the EUV light reflected by the EUV condensing mirror 23 is focused on the intermediate focal point 292 and is output to the exposure device 6. One target 27 may be irradiated with a plurality of pulses included in the pulse laser beam 33.

The EUV light generation control unit 5 collectively controls the entire EUV light generation system 11. The EUV light generation control unit 5 processes image data or the like of the target 27 captured by the target sensor 4. Also, the EUV light generation control unit 5 controls, for example, output timing of the target 27, an output direction of the target 27, or the like. Further, the EUV light generation control unit 5 controls, for example, oscillation timing of the laser device 3, a traveling direction of the pulse laser beam 32, a focusing position of the pulse laser beam 33, or the like. These various types of control are mere examples, and other types of control may be added as required.

Figure 2:
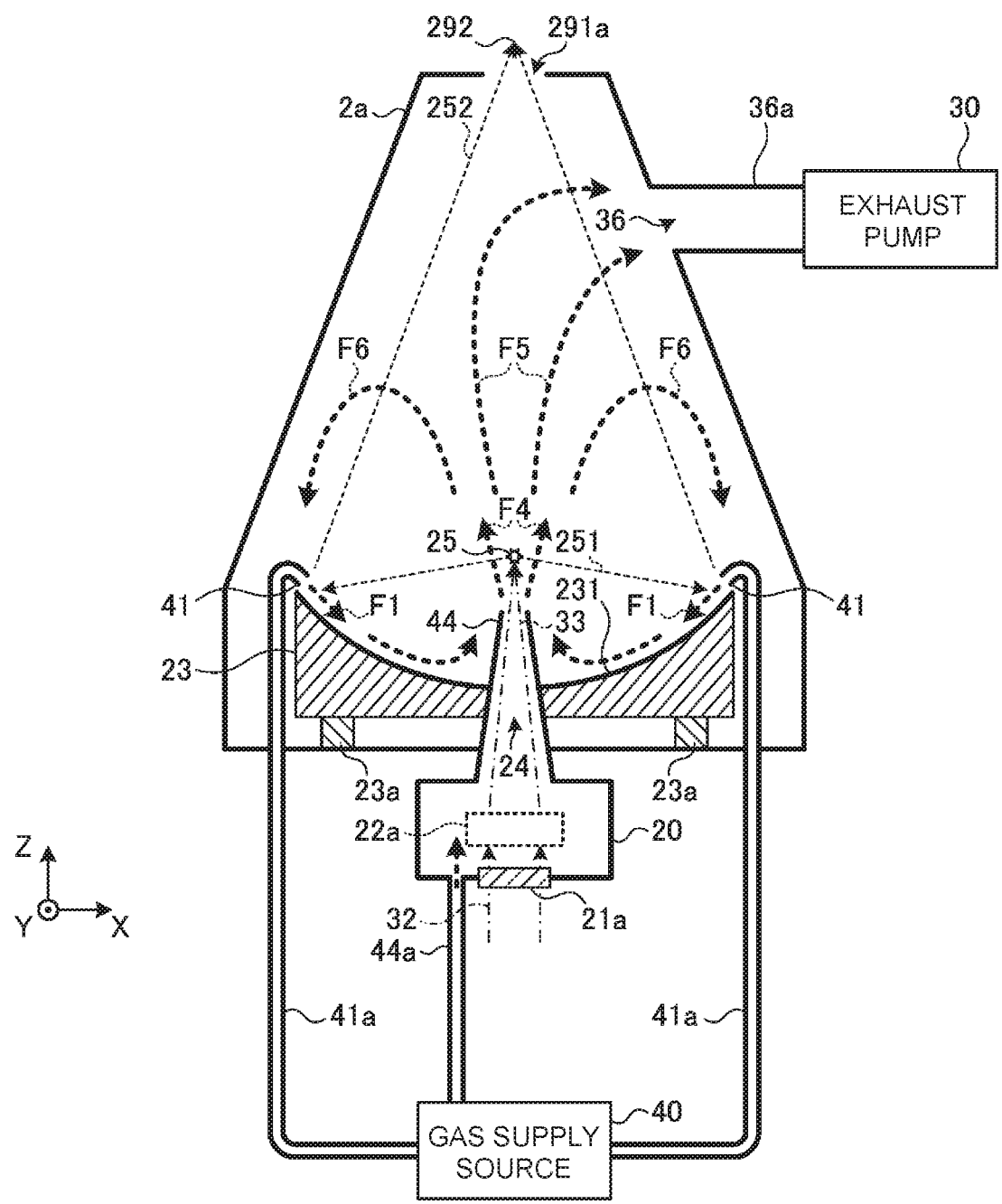
FIG. 2 schematically shows a configuration of an extreme ultraviolet chamber apparatus according to a comparative example.

2. Extreme Ultraviolet Chamber Apparatus According to Comparative Example 2.1 Configuration FIG. 2 schematically shows a configuration of an extreme ultraviolet chamber apparatus according to a comparative example. In the present disclosure, the extreme ultraviolet chamber apparatus includes a chamber 2a, components in the chamber 2a, and components around the chamber 2a. In FIG. 2, the extreme ultraviolet chamber apparatus includes a sub-chamber 20, an EUV condensing mirror 23, an exhaust pump 30, and a gas supply source 40. The extreme ultraviolet chamber apparatus may include other components.

The chamber 2a has a substantially conical shape. An end with a smaller diameter of the chamber 2a has an aperture 291a. The EUV condensing mirror 23 is secured to an end with a larger diameter of the chamber 2a via an EUV condensing mirror holder 23a. A reflective surface 231 of the EUV condensing mirror 23 has a spheroidal shape. The reflective surface 231 defines a first focal point and a second focal point. As described above, the first focal point is located in a plasma generation region 25, and the second focal point is located in an intermediate focal point 292. A central axis of EUV light in an output direction from the plasma generation region 25 toward the intermediate focal point 292 substantially matches a +Z direction.

The gas supply source 40 is connected via a pipe 44a to the sub-chamber 20. The sub-chamber 20 has a window 21a through which a pulse laser beam 32 passes. The sub-chamber 20 houses a laser beam condenser optical system 22a. The sub-chamber 20 is connected to a cylindrical laser beam path wall 44. The laser beam path wall 44 extends through a through hole 24 in the EUV condensing mirror 23 and a through hole in the end with the larger diameter of the chamber 2a. A pulse laser beam 33 having passed through the laser beam condenser optical system 22a can pass inside the laser beam path wall 44.

The gas supply source 40 is further connected via a pipe 41a to a first nozzle 41 in the chamber 2a. The first nozzle 41 is arranged in an outer peripheral portion of the EUV condensing mirror 23. In the present disclosure, the outer peripheral portion of the EUV condensing mirror 23 includes a space around an outer periphery of the EUV condensing mirror 23. A nozzle opening of the first nozzle 41 is oriented to a center of the EUV condensing mirror 23.

The gas supply source 40 includes a gas cylinder (not shown). A gas supplied to the sub-chamber 20 and the chamber 2a by the gas supply source 40 includes an etching gas or an inert gas. The etching gas includes a hydrogen gas. The inert gas includes, for example, a helium gas.

The exhaust pump 30 is connected to an exhaust pipe 36a. The exhaust pipe 36a is connected into the chamber 2a via an exhaust port 36 formed in the chamber 2a. To the exhaust pipe 36a, a particulate trap or removal equipment (not shown) may be further connected.

2.2 Operation

The pulse laser beam 33 having passed inside the laser beam path wall 44 is applied to a target 27 (see FIG. 1) supplied to the plasma generation region 25. The pulse laser beam 33 is applied to the target 27 to turn a target substance into plasma, and radiation light 251 is radiated from the plasma. The plasma generation region 25 also generates debris containing ions and neutral particles of the target substance. The debris of the target substance is diffused in the chamber 2a.

The gas supply source 40 supplies a gas into the sub-chamber 20. The gas is supplied into the sub-chamber 20 to increase pressure in the sub-chamber 20 to be higher than pressure in the chamber 2a. The gas supplied into the sub-chamber 20 flows through the inside of the laser beam path wall 44 toward the plasma generation region 25 and therearound. Arrow F4 shows a flow of the gas flowing out of the laser beam path wall 44.

The inside of the sub-chamber 20 is under positive pressure with respect to the inside of the chamber 2a, thereby preventing the debris of the target substance from entering the sub-chamber 20. Even if the debris of the target substance enters the sub-chamber 20, the gas supply source 40 supplies an etching gas to the sub-chamber 20, thereby preventing the debris of the target substance from accumulating on the laser beam condenser optical system 22a.

The gas supply source 40 also supplies the gas to the first nozzle 41 in the chamber 2a. The gas supplied to the first nozzle 41 flows from the outer peripheral portion of the EUV condensing mirror 23 along the reflective surface 231 of the EUV condensing mirror 23 toward the center of the EUV condensing mirror 23. Arrow F1 shows a flow of the gas flowing out of the first nozzle 41. A direction of arrow F1 corresponds to a first direction in the present disclosure. The gas having flowed out of the first nozzle 41 gathers around the center of the EUV condensing mirror 23, and then turns to the +Z direction, and joins the gas having flowed out of the laser beam path wall 44.

The gas fed along the reflective surface 231 of the EUV condensing mirror 23 can prevent the debris of the target substance from reaching the reflective surface 231 of the EUV condensing mirror 23. Even if the debris of the target substance reaches the reflective surface 231 of the EUV condensing mirror 23, the gas supply source 40 supplies an etching gas to the first nozzle 41, thereby preventing the debris of the target substance from accumulating on the reflective surface 231.

The exhaust pump 30 exhausts the gas so that the inside of the chamber 2a is under predetermined pressure lower than atmospheric pressure. Arrow F5 shows a flow of the gas toward the exhaust port 36 in the chamber 2a. As the gas is exhausted, the debris of the target substance is also discharged out of the chamber 2a.

2.3 Problem

The gas having flowed out of the laser beam path wall 44 and the gas having flowed out of the first nozzle 41 are not entirely immediately exhausted. Parts of the gas having flowed out of the laser beam path wall 44 and the gas having flowed out of the first nozzle 41 may pass around the plasma generation region 25, then may change their directions of flows in the chamber 2a without being exhausted, and may return near to the EUV condensing mirror 23. Arrow F6 shows a flow of the gas returning near to the EUV condensing mirror 23. Together with the gas, the debris of the target substance may also flow near to the EUV condensing mirror 23. If the debris of the target substance flows near to the EUV condensing mirror 23 and accumulates on the reflective surface of the EUV condensing mirror 23, reflectance of the EUV condensing mirror 23 decreases.

In embodiments described below, a gas is fed in a first direction from an outer peripheral portion of an EUV condensing mirror 23, and is also fed in a second direction from the outer peripheral portion of the EUV condensing mirror 23. Further, the gas may be fed in a third direction from the outer peripheral portion of the EUV condensing mirror 23. This prevents debris of a target substance from flowing near to the EUV condensing mirror 23. The second direction has a component in a +Z direction. The third direction is along a plane perpendicular to the +Z direction.

Figure 3:
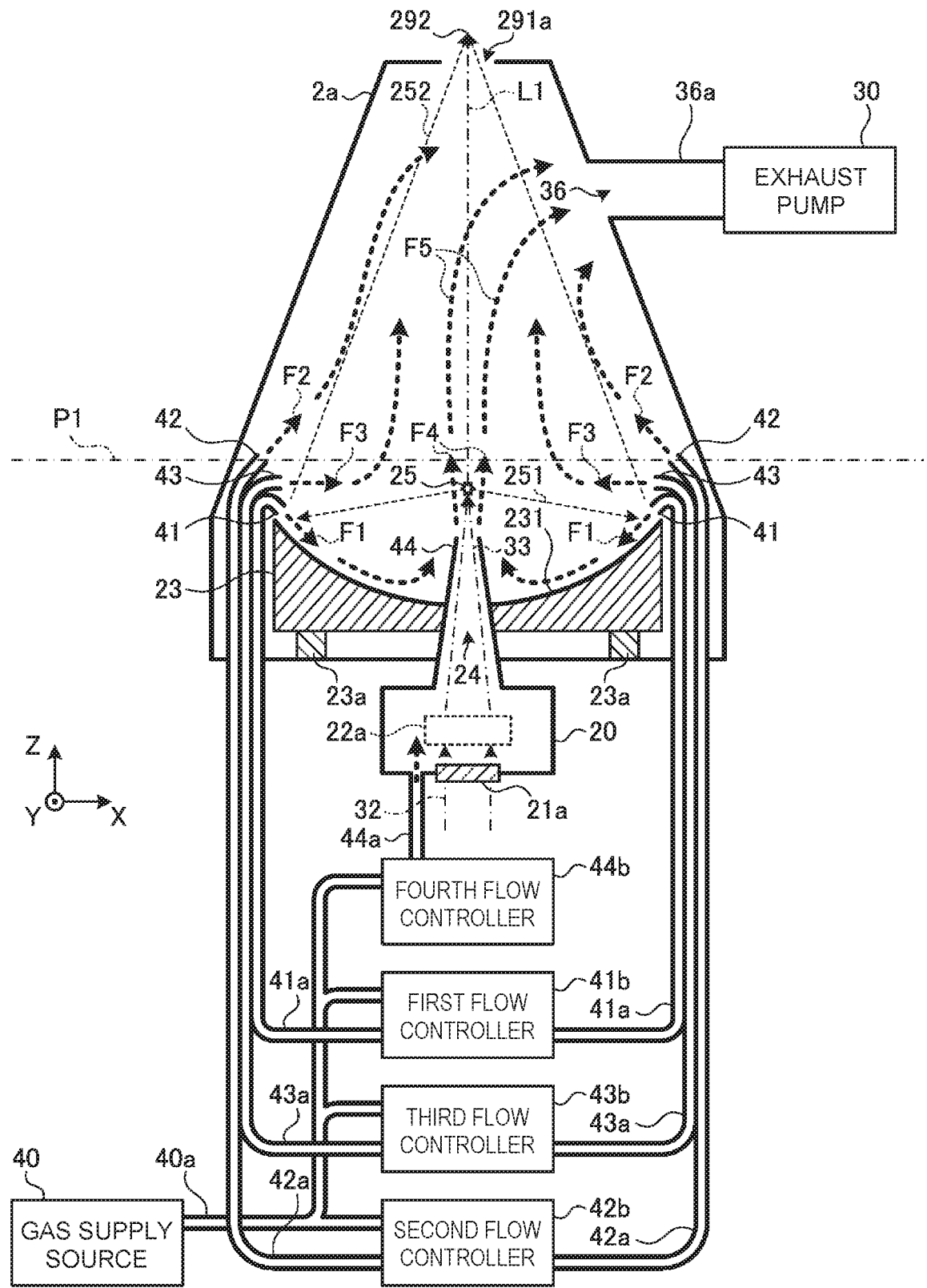
FIG. 3 schematically shows a configuration of an extreme ultraviolet chamber apparatus according to a first embodiment of the present disclosure.

3. Extreme Ultraviolet Chamber Apparatus Configured to Feed Gas in Second and Third Directions from Outer Peripheral Portion of EUV Condensing Mirror 3.1 Configuration FIG. 3 schematically shows a configuration of an extreme ultraviolet chamber apparatus according to a first embodiment of the present disclosure. In the first embodiment, the extreme ultraviolet chamber apparatus includes second and third nozzles 42, 43 and first to fourth flow controllers 41b to 44b.

The second nozzle 42 is arranged in an outer peripheral portion of the EUV condensing mirror 23. A nozzle opening of the second nozzle 42 is oriented in the second direction. Specifically, the second nozzle 42 is configured to feed the gas in the second direction. The second direction is away from the EUV condensing mirror 23. In other words, the second direction has a component in the +Z direction from a plasma generation region 25 toward an intermediate focal point 292. The second direction may be along a wall surface of a chamber 2a.

The third nozzle 43 is arranged between the first nozzle 41 and the second nozzle 42. Specifically, the third nozzle 43 is arranged in the outer peripheral portion of the EUV condensing mirror 23 like the first and second nozzles 41, 42. A nozzle opening of the third nozzle 43 is oriented in the third direction. Specifically, the third nozzle 43 is configured to feed the gas in the third direction. The third direction is along a plane P1 perpendicular to a line L1 passing through the plasma generation region 25 and the intermediate focal point 292 and is toward the line L1. The term "perpendicular" is not intended to define a precise numerical value, but includes allowable errors within a practical range. For example, errors within ±5° are allowable. An angle between the second direction and the third direction is desirably 45° or more.

An exhaust port 36 to which an exhaust pipe 36a is connected is formed in a position in the +Z direction with respect to a position of the second nozzle 42. Specifically, when the plane P1 perpendicular to the line L1 passing through the plasma generation region 25 and the intermediate focal point 292 includes the position of the second nozzle 42, the exhaust port 36 is located on a side opposite to the EUV condensing mirror 23 with respect to the plane P1.

A pipe 40a connected to a gas supply source 40 branches into four pipes. The branch pipes are connected to the first to fourth flow controllers 41b to 44b. The first to third flow controllers 41b to 43b are connected respectively via pipes 41a to 43a to the first to third nozzles 41 to 43. The fourth flow controller 44b is connected via a pipe 44a to a sub-chamber 20.

3.2 Operation and Effect

Concurrently with generation of EUV light in the chamber 2a, the first to fourth flow controllers 41b to 44b control a flow rate of the gas to be supplied from the gas supply source 40 to the chamber 2a and the sub-chamber 20.

The gas supplied to the second nozzle 42 flows away from the EUV condensing mirror 23. Arrow F2 shows a flow of the gas flowing out of the second nozzle 42. A direction of arrow F2 corresponds to a second direction in the present disclosure. The gas having flowed out of the second nozzle 42 flows near a wall surface of the chamber 2a in a +Z direction while preventing a flow of the gas in a −Z direction, that is, the gas flowing toward a reflective surface 231 of the EUV condensing mirror 23, and is exhausted from the exhaust port 36.

The gas supplied to the third nozzle 43 flows along the plane P1 toward the line L1. Arrow F3 shows a flow of the gas flowing out of the third nozzle 43. A direction of arrow F3 corresponds to a third direction in the present disclosure. The gas having flowed out of the third nozzle 43 turns to the +Z direction before reaching the line L1. Then, the gas flows between a flow path of the gas having flowed out of the first nozzle 41 in the direction of arrow F1 and a flow path of the gas having flowed out of the second nozzle 42 in the direction of arrow F2, and is exhausted from the exhaust port 36.

The second nozzle 42 and the third nozzle 43 are used to feed the gas in the second and third directions, and thus the flow of the gas in the +Z direction is dominant in the chamber 2a. This can prevent the flow of the gas in the −Z direction, and can prevent debris of a target substance from flowing near to the reflective surface 231 of the EUV condensing mirror 23. The exhaust pump 30 exhausts the gas in the chamber 2a, thereby reducing the debris of the target substance in the chamber 2a, and preventing the debris of the target substance from accumulating on the reflective surface 231 of the EUV condensing mirror 23.

The nozzle openings of the first to third nozzles 41 to 43 are desirably close to each other. For example, large spacing between the second nozzle 42 and the third nozzle 43 may generate a vortex flow between the second nozzle 42 and the third nozzle, and the flow of the gas in the −Z direction sometimes cannot be sufficiently prevented. The nozzle openings of the first to third nozzles 41 to 43 are desirably arranged in a space of 30 mm or less in a Z-axis direction.

The first to fourth flow controllers 41b to 44b supply the gas with set flow rates to the first to third nozzles 41 to 43 and the sub-chamber 20, respectively. An amount V1 of the gas fed from the first nozzle 41 is desirably larger than an amount V2 of the gas fed from the second nozzle 42. An amount V3 of the gas fed from the third nozzle 43 is desirably larger than the amount V1 of the gas fed from the first nozzle 41. The amounts of the gas are set, for example, as below.

V1=80 slm
V2=40 slm
V3=100 slm where slm (standard liters per minute) is a flow rate per minute at 0° C. and 1 atm. An amount of the gas supplied to the sub-chamber 20, that is, an amount V4 of the gas fed from the laser beam path wall 44 is set to, for example, 50 slm or more and 100 slm or less.

For other points, the first embodiment is similar to the comparative example.

Figure 4:
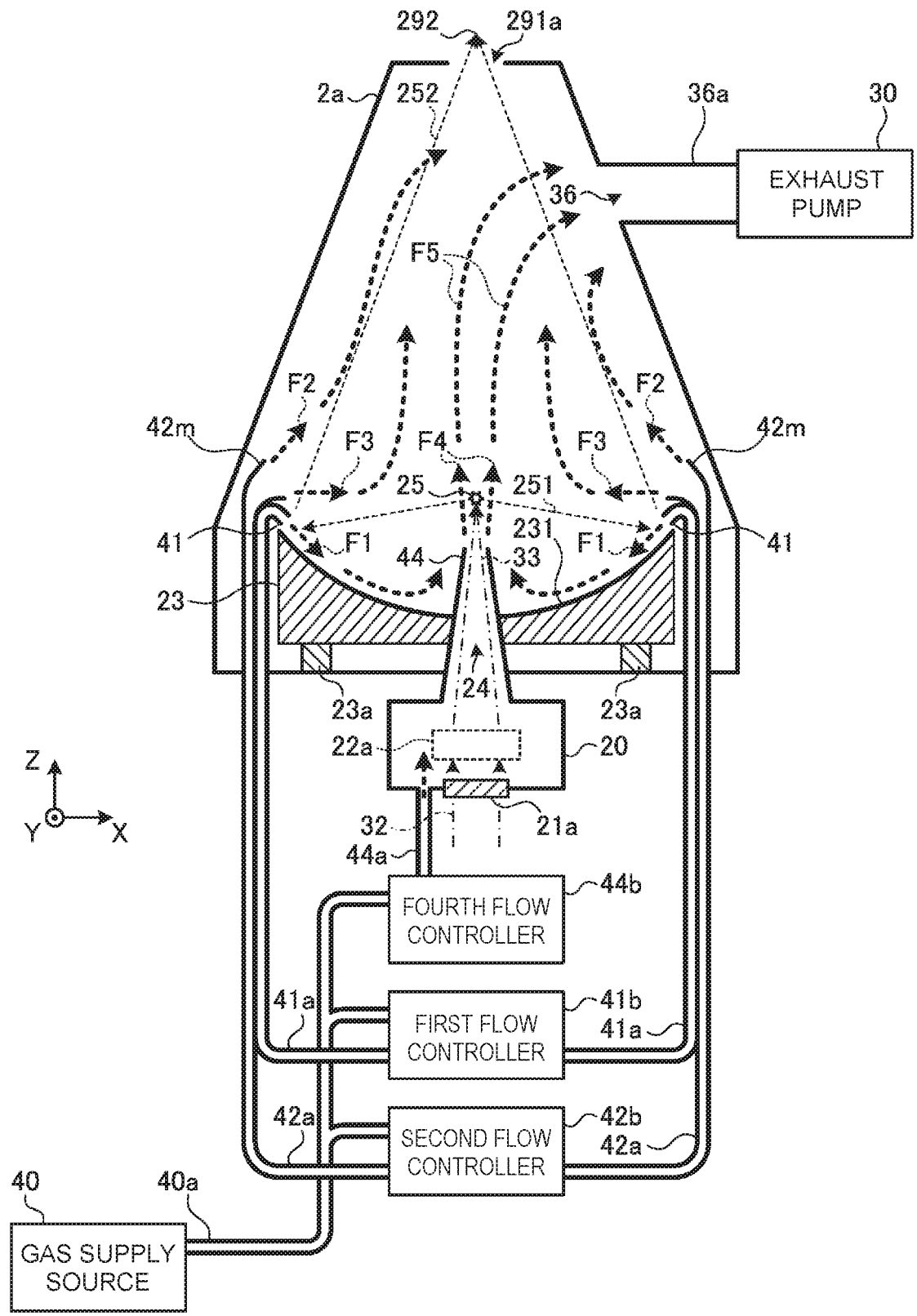
FIG. 4 schematically shows a configuration of an extreme ultraviolet chamber apparatus according to a second embodiment of the present disclosure.

4. Extreme Ultraviolet Chamber Apparatus Including Second Nozzle into which Third Nozzle is Integrated FIG. 4 schematically shows a configuration of an extreme ultraviolet chamber apparatus according to a second embodiment of the present disclosure. In the second embodiment, the extreme ultraviolet chamber apparatus includes a second nozzle 42m instead of the second and third nozzles 42, 43 (see FIG. 3). A third flow controller 43b needs not be provided.

The second nozzle 42m has a wide nozzle opening so as to be able to feed a gas in a wide angular range including both second and third directions. A second flow controller 42b controls a flow rate of a gas to be supplied to the second nozzle 42m. The flow rate of the gas to be supplied to the second nozzle 42m is set, for example, to an amount corresponding to a sum of the amounts V2 and V3.

For other points, the second embodiment is similar to the first embodiment.

Figure 5:
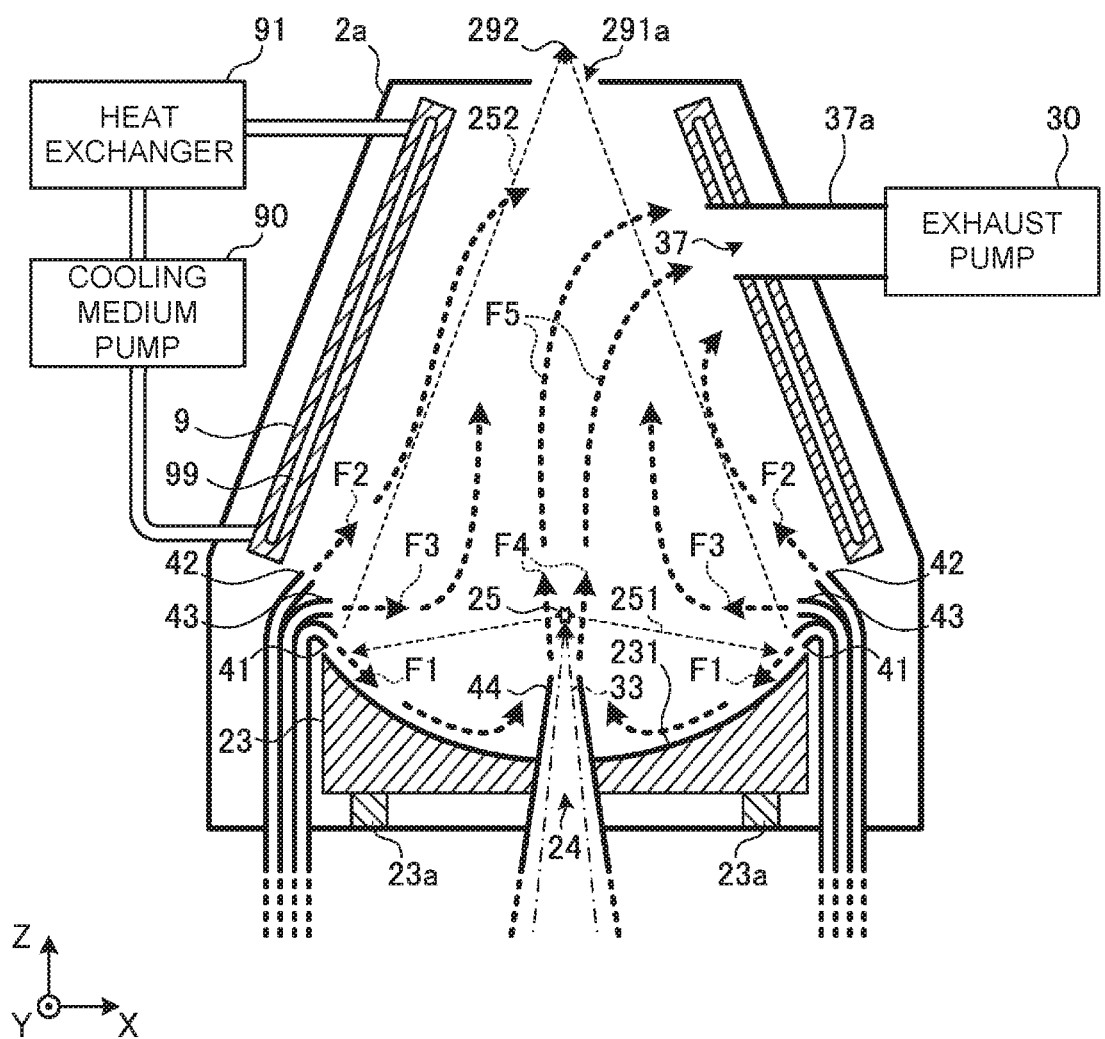
FIG. 5 schematically shows a configuration of an extreme ultraviolet chamber apparatus according to a third embodiment of the present disclosure.

5. Extreme Ultraviolet Chamber Apparatus Including Cooling Mechanism 5.1 Configuration FIG. 5 schematically shows a configuration of an extreme ultraviolet chamber apparatus according to a third embodiment of the present disclosure. In FIG. 5, a sub-chamber 20, a gas supply source 40, and first to fourth flow controllers 41b to 44b are not shown. In the third embodiment, the extreme ultraviolet chamber apparatus includes a heat shield 9, a cooling medium pump 90, and a heat exchanger 91.

The heat shield 9 has a substantially conical shape. The heat shield 9 is arranged outside an optical path of reflected light 252 reflected by an EUV condensing mirror 23 and is arranged inside a wall of a chamber 2a. Nozzle openings of first to third nozzles 41 to 43 are oriented inside the heat shield 9. Specifically, the first to third nozzles 41 to 43 are configured to feed a gas into the heat shield 9.

A pipe 37a connected to an exhaust pump 30 extends through both the wall of the chamber 2a and the heat shield 9.

A cooling medium flow path 99 is formed in the heat shield 9. The cooling medium flow path 99 is connected via a pipe to the heat exchanger 91 and the cooling medium pump 90 outside the chamber 2a.

5.2 Operation and Effect

The gas supplied from the first to third nozzles 41 to 43 into the heat shield 9 is exhausted through an opening 37 in the heat shield 9 by the exhaust pump 30.

A cooling medium such as water is fed through the cooling medium flow path 99 to cool the heat shield 9. The cooling medium having flowed through the cooling medium flow path 99 is cooled by the heat exchanger 91, and is returned via the cooling medium pump 90 to the cooling medium flow path 99.

When a hydrogen gas is supplied to the first to third nozzles 41 to 43, part of the hydrogen gas is excited by EUV light and is transformed into hydrogen radicals. Further, when tin is used as a target substance, the hydrogen radicals react with the tin to generate stannane that is gas at room temperature. Thus, the tin accumulating on a reflective surface 231 of the EUV condensing mirror 23 is etched. Alternatively, the tin is prevented from depositing on the reflective surface 231.

However, stannane is easily dissociated into hydrogen and tin at high temperature. Arranging the heat shield 9 including the cooling mechanism prevents dissociation of the stannane, and allows the stannane as gas to be exhausted. A temperature of the heat shield 9 is desirably maintained, for example, at 5° C. or lower.

For other points, the third embodiment is similar to the first or second embodiment.

6. Details of Nozzle 6.1 Orientation of Nozzle

Figure 6A:
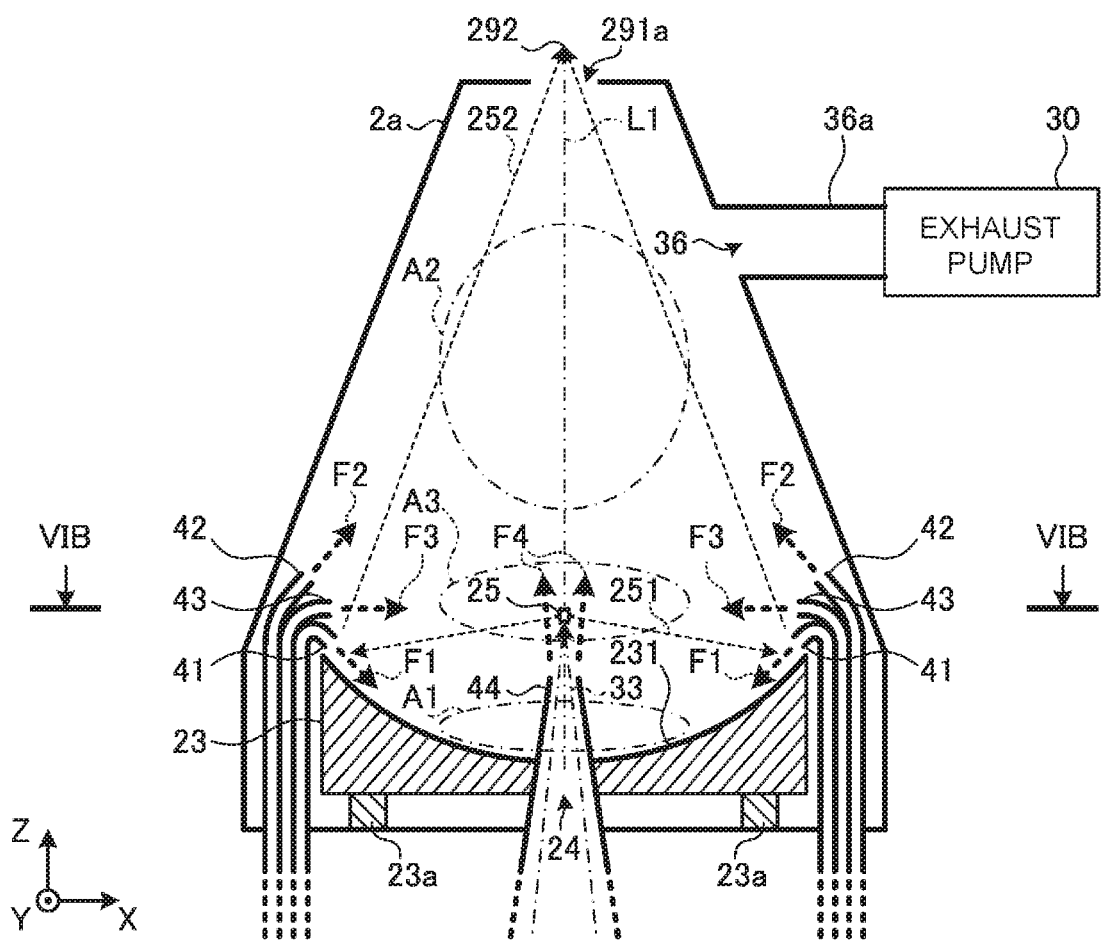
FIG. 6A illustrates, in detail, a configuration of a nozzle in the present disclosure.

FIG. 6A illustrates, in detail, a configuration of a nozzle in the present disclosure. An extreme ultraviolet chamber apparatus in FIG. 6A has substantially the same configuration as the extreme ultraviolet chamber apparatus according to the first embodiment described with reference to FIG. 3. In FIG. 6A, a sub-chamber 20, a gas supply source 40, and first to fourth flow controllers 41b to 44b are not shown. In FIG. 6A, arrows indicating flows of a gas are partially omitted. With reference to FIG. 6A, orientations of the first to third nozzles 41 to 43 will be described in detail.

A line L1 passes through a plasma generation region 25 and an intermediate focal point 292. The plasma generation region 25 corresponds to a first focal point in the present disclosure, and the intermediate focal point 292 corresponds to a second focal point in the present disclosure.

The gas supplied to the first nozzle 41 flows out of the first nozzle 41 in a first direction indicated by arrow F1. The first direction is toward a first region A1 including a part of the line L1. The first region A1 is located closer to an EUV condensing mirror 23 than the plasma generation region 25.

The gas supplied to the second nozzle 42 flows out of the second nozzle 42 in a second direction indicated by arrow F2. The second direction is toward a second region A2 including a part of the line L1. The second region A2 is located on a side opposite to the EUV condensing mirror 23 with respect to the plasma generation region 25.

The gas supplied to the third nozzle 43 flows out of the third nozzle 43 in a third direction indicated by arrow F3. The third direction is toward a third region A3 including a part of the line L1. The third region A3 is located between the first region A1 and the second region A2.

In the present disclosure, the first to third directions are directions of the gas flowing out of the first to third nozzles 41 to 43, respectively. If the gas flowing out of the first to third nozzles 41 to 43 then changes its direction to a fourth direction, the fourth direction is not included in the first to third directions.

The first to third directions have been described here with substantially the same configuration as in the first embodiment. The first to third directions may apply similarly to the second and third embodiments.

6.2 Configuration of Nozzle Opening 6.2.1 First Example

Figure 6B:
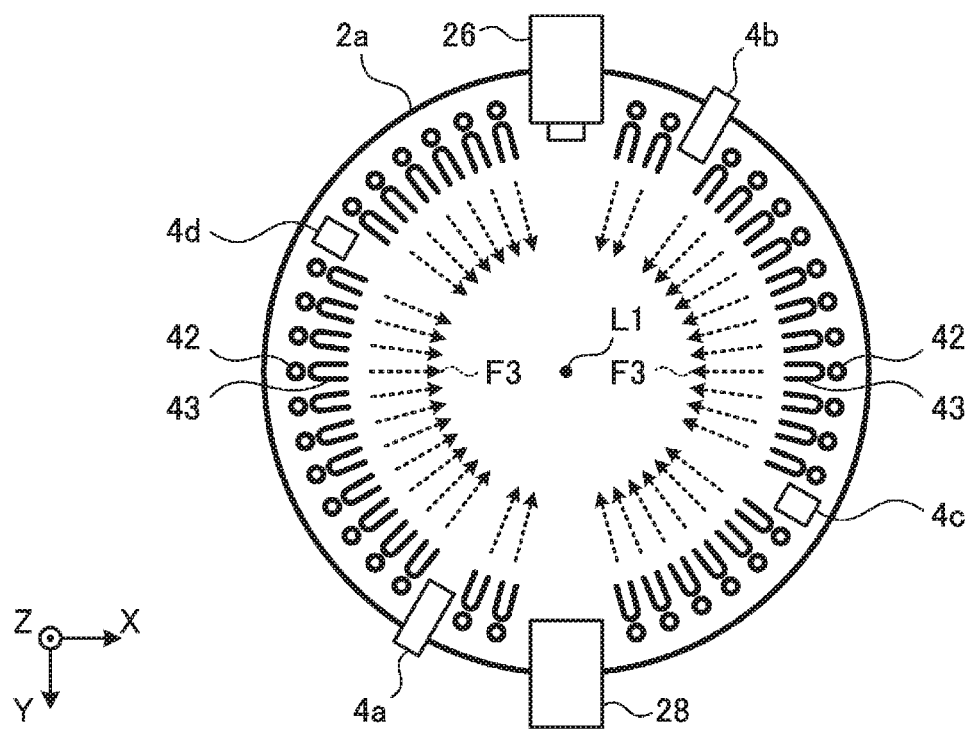
FIG. 6B shows a first example of a configuration of a nozzle opening.

FIG. 6B shows a first example of a configuration of a nozzle opening. FIG. 6B is a sectional view taken along the line VIB-VIB in FIG. 6A. In FIG. 6B, an EUV condensing mirror 23 and a laser beam path wall 44 are not shown. FIG. 6B shows a target supply unit 26, a target collecting unit 28, a target position sensor 4a, a target position sensor light source 4b, and EUV sensors 4c, 4d arranged in an outer peripheral portion of the EUV condensing mirror 23.

The target position sensor light source 4b illuminates a target 27. This allows the target position sensor 4a to capture an image of the target 27. The target position sensor 4a captures an image of the target at predetermined timing to detect a position of the target at predetermined timing. The EUV sensors 4c, 4d detect energy of EUV light.

FIG. 6B shows a section including a nozzle opening of a third nozzle 43. The third nozzle 43 is constituted by a plurality of tubes. The tubes have, at their ends, nozzle openings. As such, the third nozzle 43 has the plurality of nozzle openings. The nozzle openings of the third nozzle 43 are arranged side by side at substantially regular intervals over substantially the entire outer peripheral portion of the EUV condensing mirror 23 in a plane substantially parallel to an XY plane. The nozzle openings each are oriented to the line L1.

If components other than the first to third nozzles 41 to 43 are arranged in the outer peripheral portion of the EUV condensing mirror 23, nozzle openings need not be arranged in positions of the components. For example, nozzle openings of the third nozzle 43 need not be arranged in positions of the target supply unit 26, the target collecting unit 28, the target position sensor 4a, the target position sensor light source 4b, and the EUV sensors 4c, 4d.

In FIG. 6B, the third nozzle 43 has been described, but the same may apply to a first nozzle 41 and a second nozzle 42.

6.2.2 Second Example

Figure 7:
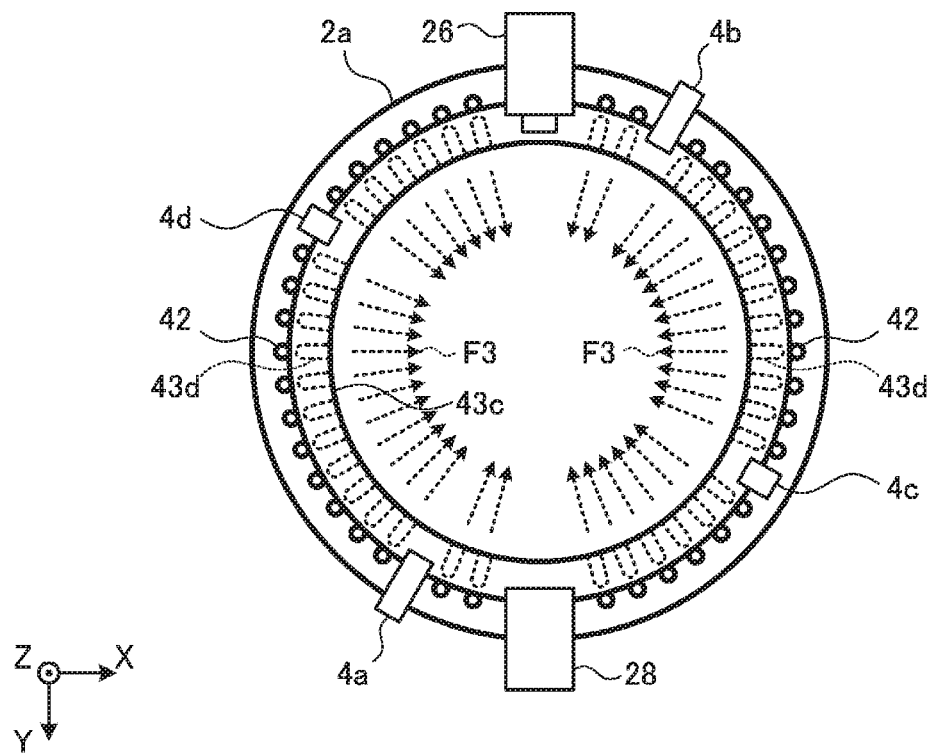
FIG. 7 shows a second example of a configuration of a nozzle opening.

FIG. 7 shows a second example of a configuration of a nozzle opening. In the second example, a third nozzle 43 is constituted by an annular nozzle member 43c. The nozzle member 43c has a plurality of gas flow paths 43d, and outlets of the gas flow paths 43d constitute a plurality of nozzle openings.

Other points may be similar to those in the first example described with reference to FIG. 6B.

In FIG. 7, the third nozzle 43 has been described, but the same may apply to a first nozzle 41 and a second nozzle 42.

6.2.3 Third Example

Figure 8:
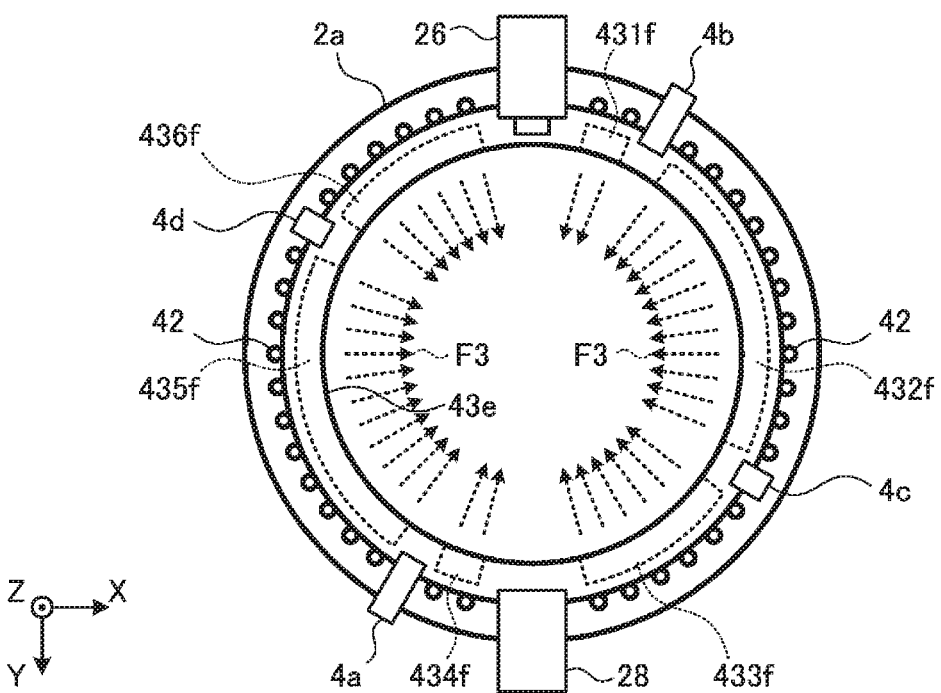
FIG. 8 shows a third example of a configuration of a nozzle opening.

FIG. 8 shows a third example of a configuration of a nozzle opening. In the third example, a third nozzle 43 is constituted by an annular nozzle member 43e. The nozzle member 43e has slit-like gas flow paths 431f to 436f, and outlets of the slit-like gas flow paths 431f to 436f constitute a plurality of nozzle openings.

Other points may be similar to those in the first example described with reference to FIG. 6B.

In FIG. 8, the third nozzle 43 has been described, but the same may apply to a first nozzle 41 and a second nozzle 42.

6.2.4 Fourth Example

Figure 9:
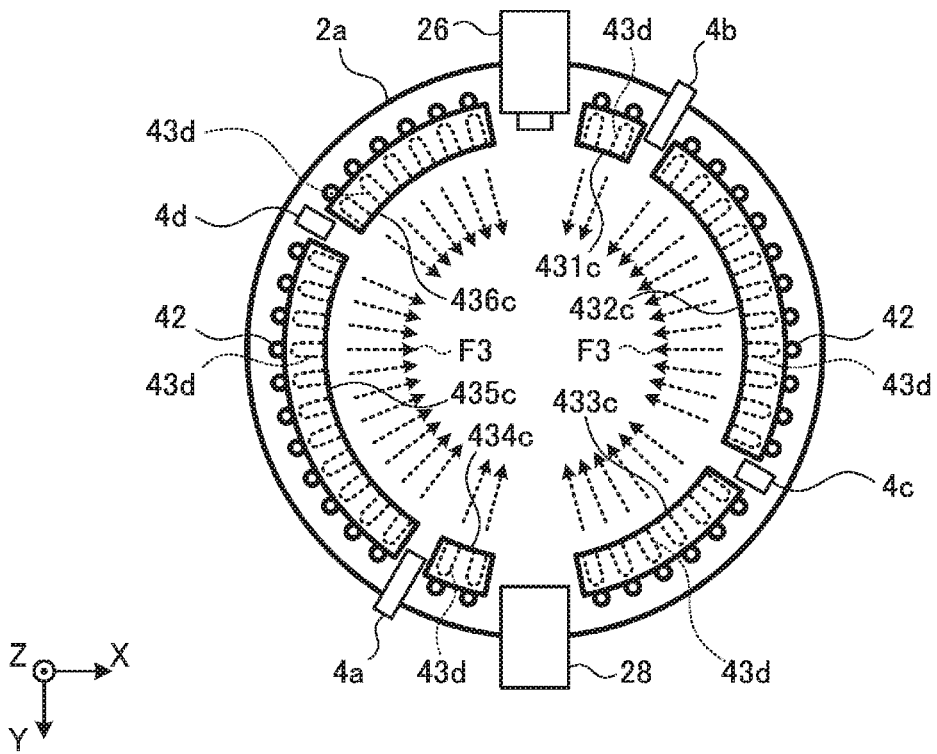
FIG. 9 shows a fourth example of a configuration of a nozzle opening.

FIG. 9 shows a fourth example of a configuration of a nozzle opening. In the fourth example, a third nozzle 43 is constituted by a plurality of nozzle members 431c to 436c. The nozzle members 431c to 436c each have a plurality of gas flow paths 43d, and outlets of the gas flow paths 43d constitute a plurality of nozzle openings.

Other points may be similar to those in the second example described with reference to FIG. 7.

In FIG. 9, the third nozzle 43 has been described, but the same may apply to a first nozzle 41 and a second nozzle 42.

6.2.5 Fifth Example

Figure 10:
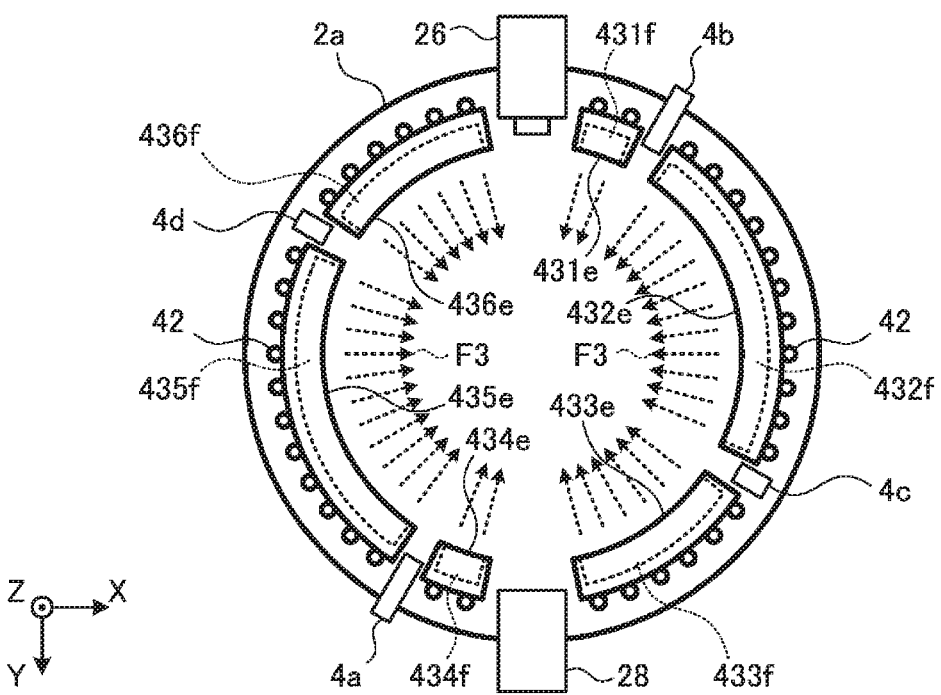
FIG. 10 shows a fifth example of a configuration of a nozzle opening.

FIG. 10 shows a fifth example of a configuration of a nozzle opening. In the fifth example, a third nozzle 43 is constituted by a plurality of nozzle members 431e to 436e. The nozzle members 431e to 436e have slit-like gas flow paths 431f to 436f, and outlets of the slit-like gas flow paths 431f to 436f constitute a plurality of nozzle openings.

Other points may be similar to those in the third example described with reference to FIG. 8.

In FIG. 10, the third nozzle 43 has been described, but the same may apply to a first nozzle 41 and a second nozzle 42.

6.2.6 Sixth Example

Figure 11:
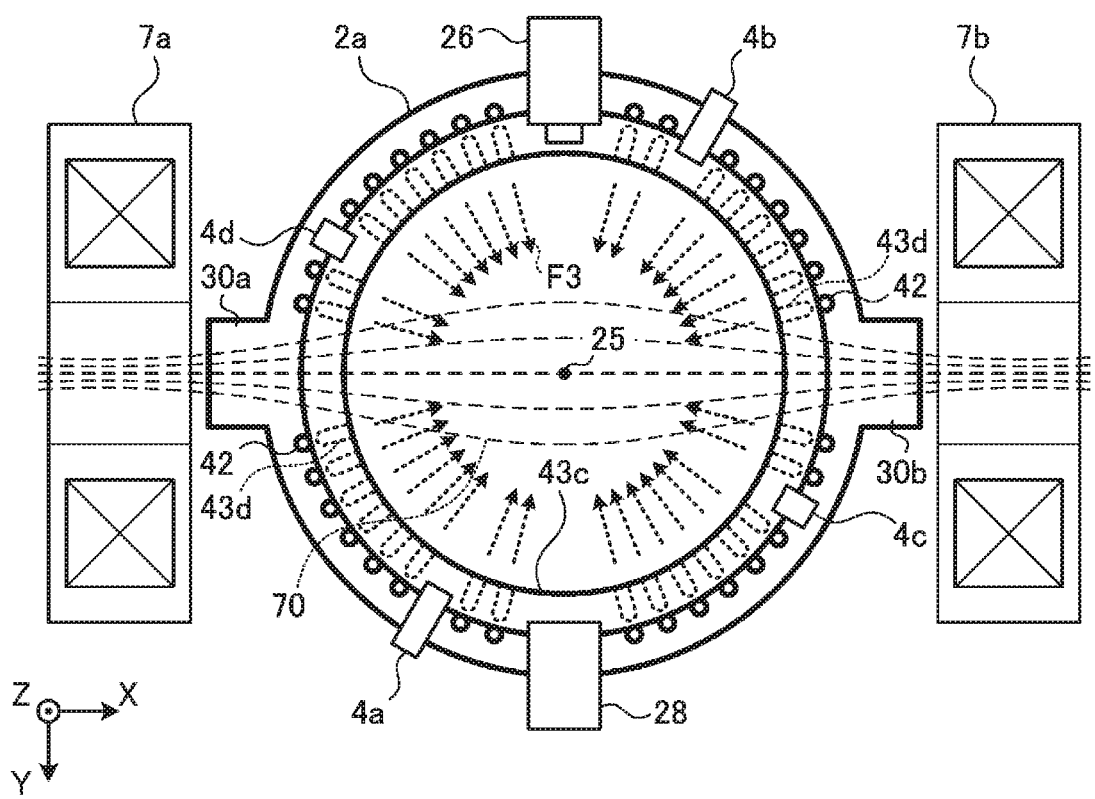
FIG. 11 shows a sixth example of a configuration of a nozzle opening.

FIG. 11 shows a sixth example of a configuration of a nozzle opening. In the sixth example, an extreme ultraviolet chamber apparatus includes magnets 7a, 7b arranged outside a chamber 2a.

The magnets 7a, 7b are electromagnets with superconductive coils. The magnets 7a, 7b are located with a plasma generation region 25 therebetween. The magnets 7a, 7b are arranged so that central axes of the superconductive coils are substantially coaxial and pass through the plasma generation region 25. Currents in the same direction are supplied to the superconductive coils to generate a magnetic field 70 at and around the central axes of the superconductive coils. The magnetic field 70 extends over the plasma generation region 25 in the chamber 2a. A central axis of the magnetic field 70 substantially matches the central axes of the superconductive coils and a +X direction.

Exhaust passages 30a, 30b are connected to the chamber 2a. Connecting positions between the chamber 2a and the exhaust passages 30a, 30b match the central axis of the magnetic field 70.

Part of ions of a target substance contained in plasma are trapped by the magnetic field 70. Thus, many target substances are distributed around dashed lines indicating the magnetic field 70 in FIG. 11. An exhaust pump (not shown) connected to the exhaust passages 30a, 30b is driven to exhaust a gas. This allows the ions of the target substances distributed around the magnetic field 70 to be discharged out of the chamber 2a.

Gas flow paths 43d included in a third nozzle 43 need not be arranged in positions of the exhaust passages 30a, 30b. Thus, nozzle openings of the third nozzle 43 need not be arranged in the positions of the exhaust passages 30a, 30b.

Other points may be similar to those in the second example described with reference to FIG. 7.

In FIG. 11, the third nozzle 43 has been described, but the same may apply to a first nozzle 41 and a second nozzle 42.

6.2.7 Seventh Example

Figure 12:
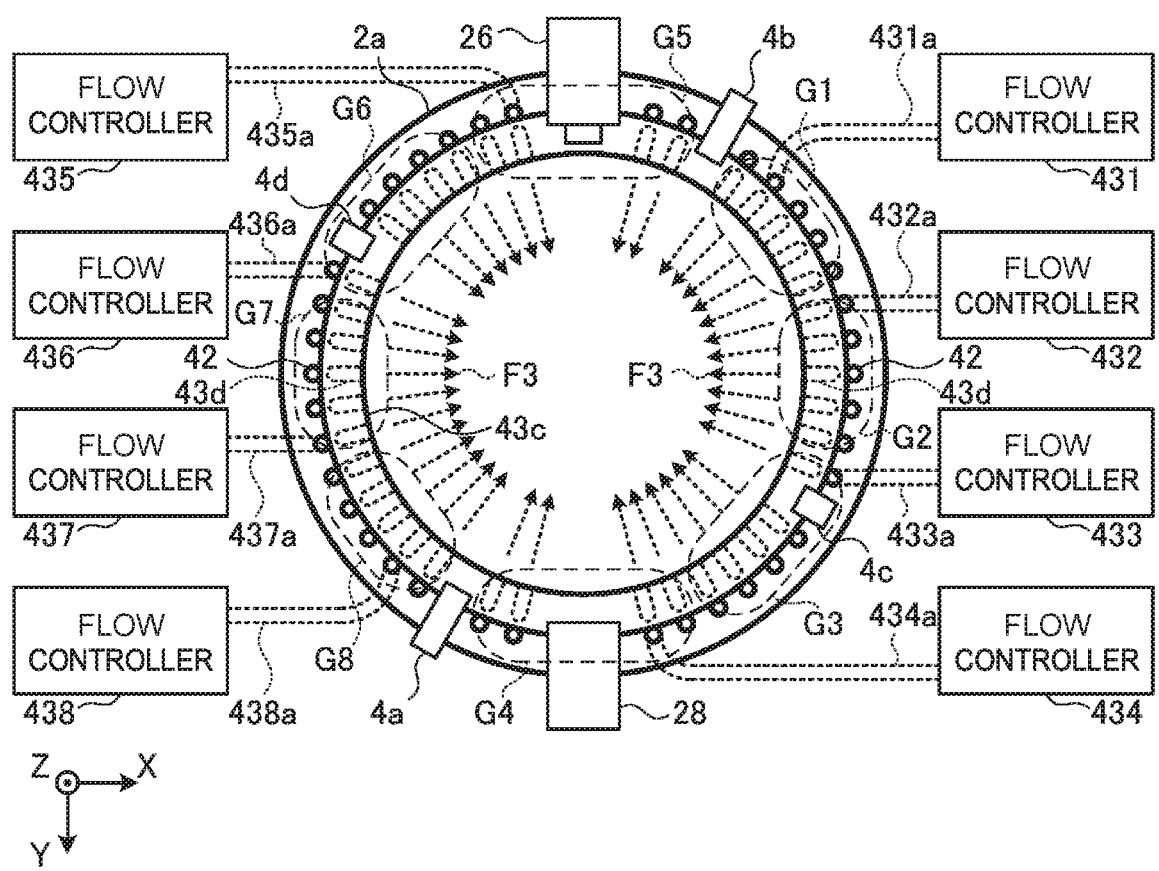
FIG. 12 shows a seventh example of a configuration of a nozzle opening.

FIG. 12 shows a seventh example of a configuration of a nozzle opening. In the seventh example, an extreme ultraviolet chamber apparatus includes flow controllers 431 to 438.

A plurality of gas flow paths 43d included in a third nozzle 43 are classified into eight groups G1 to G8. The eight groups G1 to G8 each include a plurality of gas flow paths 43d. The adjacent gas flow paths 43d desirably belong to the same group.

The flow controller 431 is connected via a gas supply pipe 431a to the gas flow paths 43d belonging to the group G1. The flow controller 432 is connected via a gas supply pipe 432a to the gas flow paths 43d belonging to the group G2. Similarly, the flow controllers 433 to 438 are connected via gas supply pipes 433a to 438a to the gas flow paths 43d belonging to the groups G3 to G8, respectively. For example, outlets of the gas flow paths 43d belonging to the group G1 correspond to two or more first nozzle openings configured to feed a gas supplied from a first gas supply pipe. Outlets of the gas flow paths 43d belonging to the group G2 correspond to two or more second nozzle openings configured to feed a gas supplied from a second gas supply pipe.

The flow controller 431 controls an amount of the gas to be supplied to the gas flow paths 43*d* belonging to the group G1. The flow controller 432 controls an amount of the gas to be supplied to the gas flow paths 43*d* belonging to the group G2. Similarly, the flow controllers 433 to 438 control amounts of the gas to be supplied to the gas flow paths 43*d* belonging to the groups G3 to G8, respectively. This can allow a flow rate of the gas to be supplied to the third nozzle 43 to be adjusted for each group, and can optimize a flow of the gas in a chamber 2*a*.

Other points may be similar to those in the second example described with reference to FIG. 7.

In FIG. 12, the third nozzle 43 has been described, but the same may apply to a first nozzle 41 and a second nozzle 42.

7. Variant of Exhaust Port 7.1 First Variant

Figure 13:
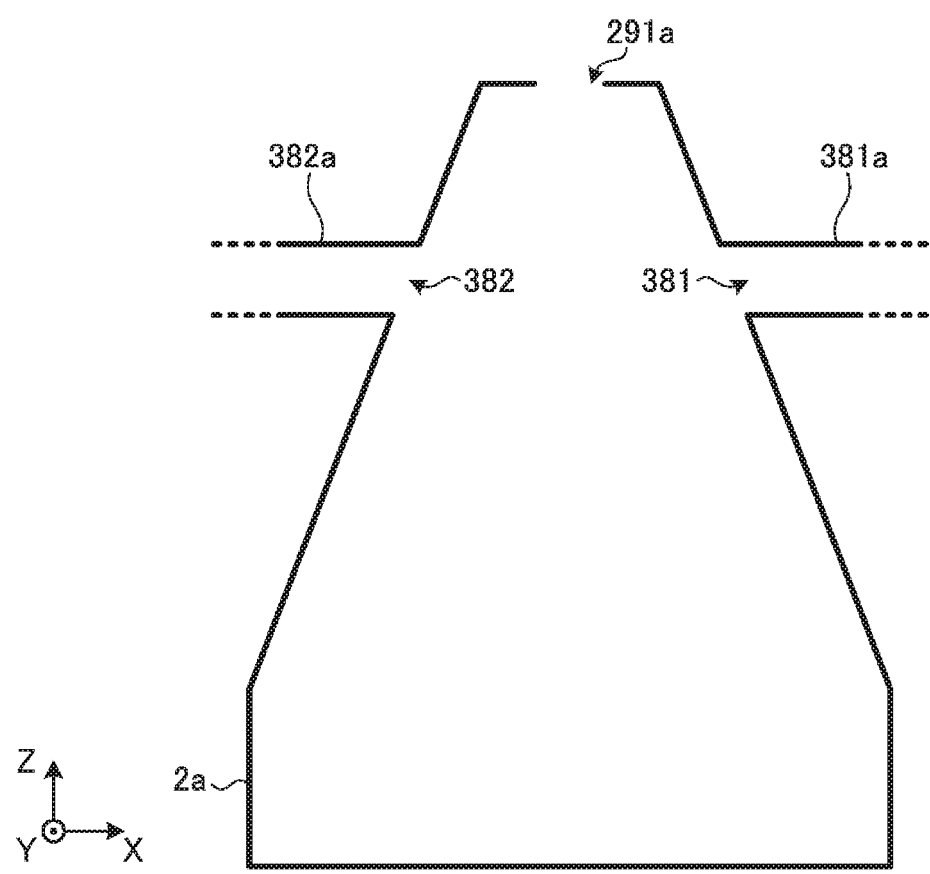
FIG. 13 shows a first variant of an exhaust port.

FIG. 13 shows a first variant of an exhaust port. In FIG. 13, components in a chamber 2*a* are not shown. In FIGS. 3 to 6A, a case where one exhaust port 36 or 37 is formed has been described, but the present disclosure is not limited to this. A plurality of exhaust ports 381, 382 may be formed and exhaust pipes 381*a*, 382*a* may be connected to the exhaust ports 381, 382, respectively. Forming the exhaust ports 381, 382 can prevent turbulence of an exhausted gas.

The exhaust pipes 381*a*, 382*a* are connected to an exhaust pump (not shown). Separate exhaust pumps may be connected to the exhaust pipes 381*a*, 382*a*, or a common exhaust pump may be connected to the exhaust pipes 381*a*, 382*a* joined. Different flow rates of an exhaust gas may be set to different exhaust pipes to optimize a flow of the exhaust gas.

Other points may be similar to those in the embodiments described above.

7.2 Second Variant

Figure 14:
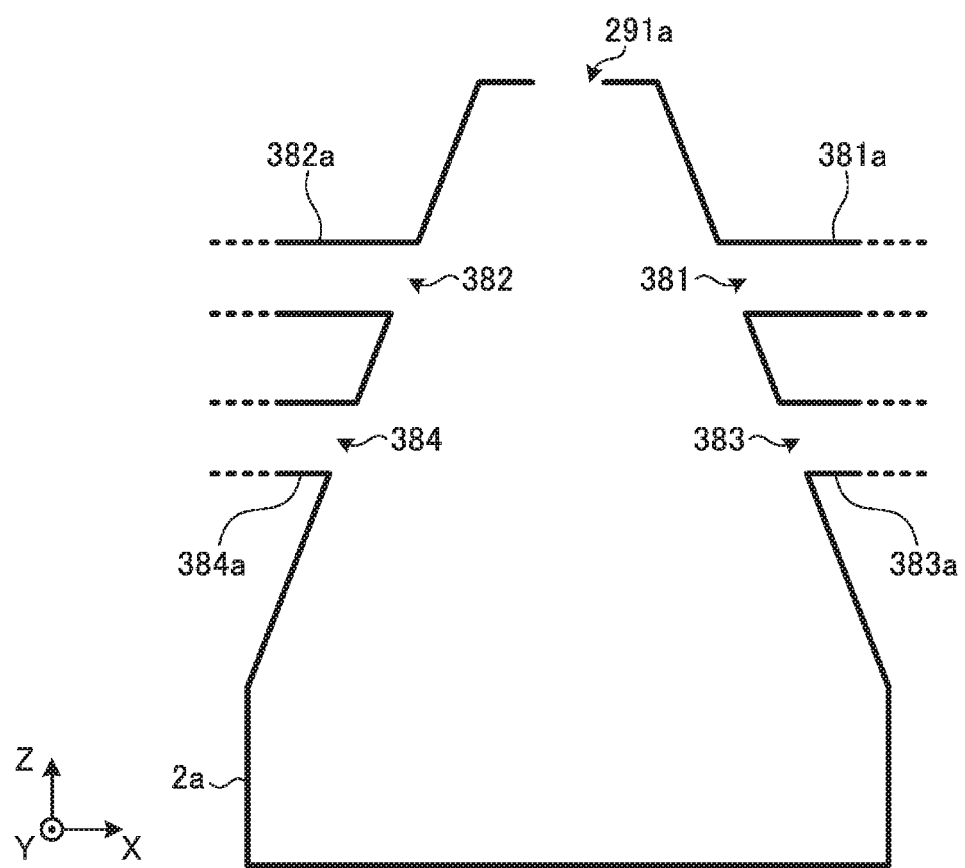
FIG. 14 shows a second variant of an exhaust port.

FIG. 14 shows a second variant of an exhaust port. In the second variant, more exhaust ports 381 to 384 are formed, and exhaust pipes 381*a* to 384*a* are connected to the exhaust ports 381 to 384, respectively. The exhaust ports 381 to 384 may be formed in different positions in a Z-axis direction.

The exhaust ports 381 to 384 need not be symmetrically arranged, but may be asymmetrically arranged. For example, among the exhaust ports 381 to 384 in FIG. 14, only the exhaust port 381 and the exhaust port 384 may be formed. The number of the exhaust ports is not particularly limited.

Other points may be similar to those in the first variant.

7.3 Third Variant

Figure 15A:
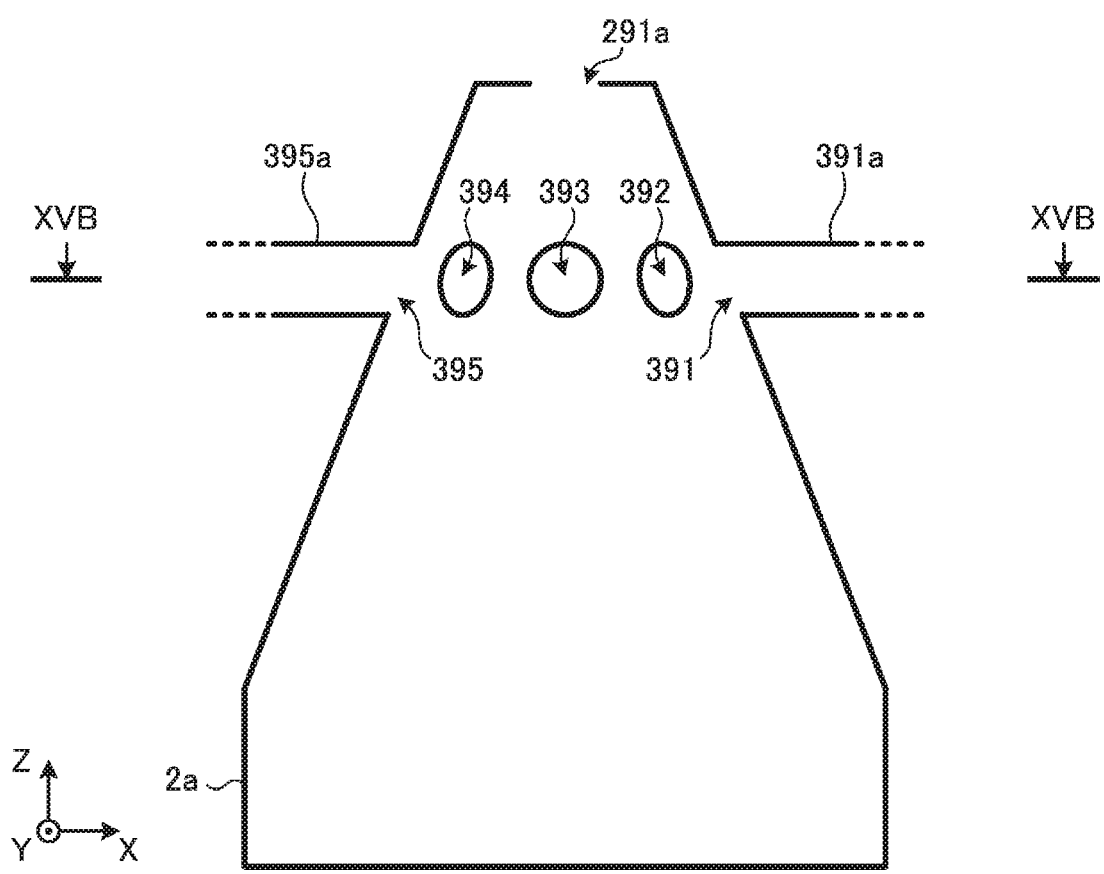
FIG. 15A shows a third variant of an exhaust port.

FIG. 15A shows a third variant of an exhaust port. FIG. 15B is a sectional view taken along the line XVB-XVB in FIG. 15A. In the third variant, a plurality of exhaust ports 391 to 398 may be arranged side by side around an axis parallel to a +Z direction. Exhaust pipes 391*a* to 398*a* may be radially arranged.

Other points may be similar to those in the first or second variant.

8. Others

Figure 16:
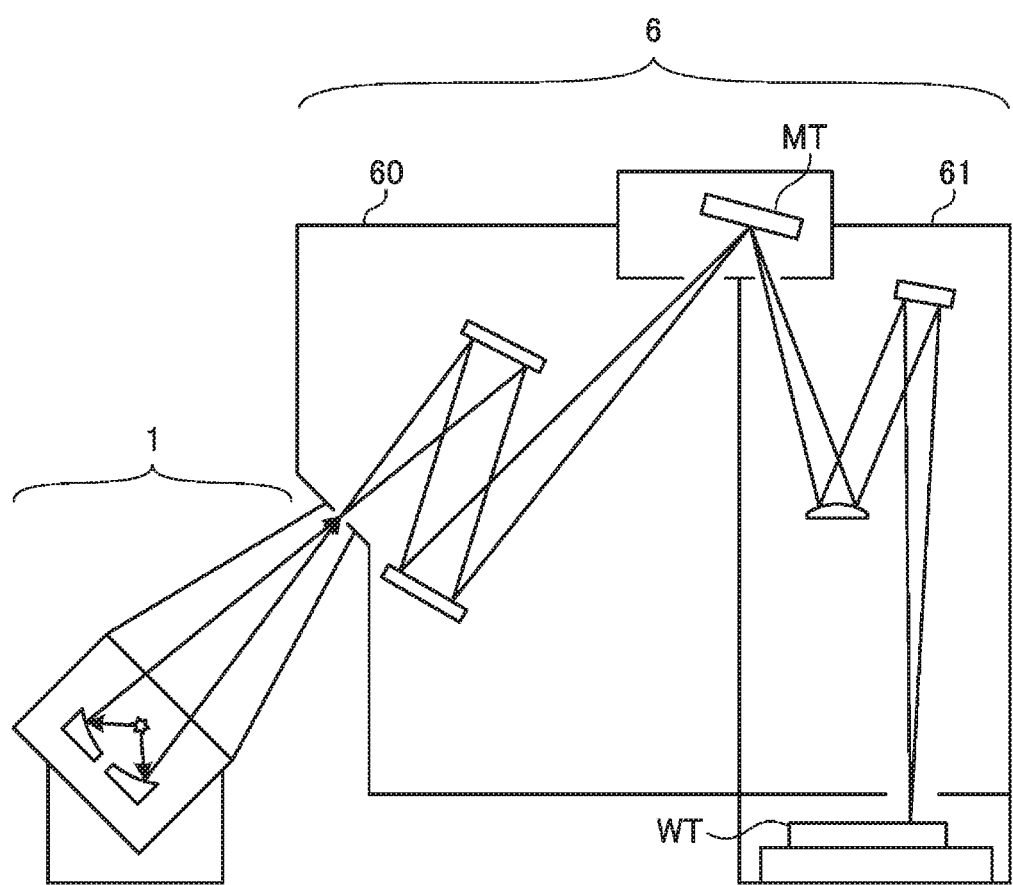
FIG. 16 schematically shows a configuration of an exposure device 6 connected to an EUV light generation apparatus 1.

FIG. 16 schematically shows a configuration of an exposure device 6 connected to an EUV light generation apparatus 1.

In FIG. 16, the exposure device 6 includes a mask illumination unit 60 and a workpiece illumination unit 61. The mask illumination unit 60 illuminates a mask pattern on a mask table MT with EUV light incident from the EUV light generation apparatus 1 via a catoptric system. The workpiece illumination unit 61 focuses the EUV light reflected by the mask table MT onto a workpiece (not shown) arranged on a workpiece table WT via the catoptric system. The workpiece is a photosensitive substrate such as a semiconductor wafer coated with a photoresist. The exposure device 6 synchronously moves the mask table MT and the workpiece table WT in parallel to expose the workpiece to the EUV light reflecting the mask pattern. A device pattern can be transferred to the semiconductor wafer by an exposure step as described above to manufacture an electronic device.

The above descriptions are intended to be illustrative only and not restrictive. Thus, it will be apparent to those skilled in the art that modifications may be made in the embodiments of the present disclosure without departing from the scope of the claims. It will be also apparent to those skilled in the art that the embodiments of the present disclosure may be combined.

The terms used throughout the specification and the claims should be interpreted as "non-limiting" unless otherwise specified. For example, the term "comprising" or "comprised" should be interpreted as "not limited to what has been described as being comprised". The term "having" should be interpreted as "not limited to what has been described as having". Also, the indefinite article "a/an" should be interpreted to mean "at least one" or "one or more". Further, the term "at least one of A, B, and C" should be interpreted to include "A", "B", "C", "A+B", "A+C", "B+C", or "A+B+C". This term should also be interpreted to include a combination of "A, B, and C" with something other than them.

What is claimed is:

1. An extreme ultraviolet chamber apparatus comprising:
    a chamber;
    an EUV condensing mirror arranged in the chamber;
    a first nozzle arranged in an outer peripheral portion of the EUV condensing mirror and configured to feed a gas in a first direction along a reflective surface of the EUV condensing mirror;
    a second nozzle arranged in the outer peripheral portion of the EUV condensing mirror and configured to feed a gas in a second direction away from the EUV condensing mirror;
    an exhaust port arranged in the chamber; and
    a third nozzle arranged between the first nozzle and the second nozzle, wherein
    the EUV condensing mirror has a spheroidal reflective surface, and
    the third nozzle is arranged in the outer peripheral portion of the EUV condensing mirror, and feeds a gas in a third direction, the third direction being along a plane perpendicular to a line passing through a first focal point and a second focal point of the spheroidal reflective surface and being toward the line.

2. The extreme ultraviolet chamber apparatus according to claim 1, wherein
    the exhaust port is located on a side opposite to the EUV condensing mirror with respect to the plane, the plane including a position of the second nozzle.

3. The extreme ultraviolet chamber apparatus according to claim 1, wherein
    the second direction has a component in a direction from the first focal point toward the second focal point of the spheroidal reflective surface, the second focal point being located on a side opposite to the EUV condensing mirror with respect to the first focal point.

4. The extreme ultraviolet chamber apparatus according to claim 1, wherein
    the second nozzle has a plurality of nozzle openings.

5. The extreme ultraviolet chamber apparatus according to claim 4, wherein
the nozzle openings are arranged side by side in the outer peripheral portion of the EUV condensing mirror.

6. The extreme ultraviolet chamber apparatus according to claim 4, wherein
the nozzle openings include two or more first nozzle openings configured to feed a gas supplied from a first gas supply pipe, and two or more second nozzle openings configured to feed a gas supplied from a second gas supply pipe.

7. The extreme ultraviolet chamber apparatus according to claim 1, wherein
the second nozzle feeds a gas in both the second direction and the third direction.

8. The extreme ultraviolet chamber apparatus according to claim 1, wherein
the third nozzle has a plurality of nozzle openings.

9. The extreme ultraviolet chamber apparatus according to claim 8, wherein
the nozzle openings are arranged side by side in the outer peripheral portion of the EUV condensing mirror.

10. The extreme ultraviolet chamber apparatus according to claim 8, wherein
the nozzle openings include two or more first nozzle openings configured to feed a gas supplied from a first gas supply pipe, and two or more second nozzle openings configured to feed a gas supplied from a second gas supply pipe.

11. The extreme ultraviolet chamber apparatus according to claim 1, further comprising
a first flow controller configured to control an amount of the gas fed from the first nozzle, and a second flow controller configured to control an amount of the gas fed from the second nozzle,
the amount of the gas fed from the first nozzle being larger than the amount of the gas fed from the second nozzle.

12. The extreme ultraviolet chamber apparatus according to claim 11, further comprising
a third flow controller configured to control an amount of a gas fed from the third nozzle,
the amount of the gas fed from the third nozzle being larger than the amount of the gas fed from the first nozzle.

13. The extreme ultraviolet chamber apparatus according to claim 1, wherein
the first direction is toward a first region including a part of the line, the second focal point being located on a side opposite to the EUV condensing mirror with respect to the first focal point, the first region being located closer to the EUV condensing mirror than the first focal point.

14. The extreme ultraviolet chamber apparatus according to claim 13, wherein
the second direction is toward a second region, the second region including a part of the line and being located on the side opposite to the EUV condensing mirror with respect to the first focal point.

15. An extreme ultraviolet chamber apparatus comprising:
a chamber;
an EUV condensing mirror arranged in the chamber;
a first nozzle arranged in an outer peripheral portion of the EUV condensing mirror and configured to feed a gas in a first direction along a reflective surface of the EUV condensing mirror;
a second nozzle arranged in the outer peripheral portion of the EUV condensing mirror and configured to feed a gas in a second direction away from the EUV condensing mirror;
an exhaust port arranged in the chamber; and
a third nozzle arranged between the first nozzle and the second nozzle, wherein
the EUV condensing mirror has a spheroidal reflective surface, and
the first, second, and third nozzles are arranged in a space of 30 mm or less in a direction of a line passing through a first focal point and a second focal point of the spheroidal reflective surface.

16. The extreme ultraviolet chamber apparatus according to claim 15, wherein
the exhaust port is located on a side opposite to the EUV condensing mirror with respect to a plane perpendicular to the line, the plane including a position of the second nozzle.

17. The extreme ultraviolet chamber apparatus according to claim 15, wherein
the second direction has a component in a direction from the first focal point toward the second focal point of the spheroidal reflective surface, the second focal point being located on a side opposite to the EUV condensing mirror with respect to the first focal point.

18. The extreme ultraviolet chamber apparatus according to claim 15, further comprising
a first flow controller configured to control an amount of the gas fed from the first nozzle, and a second flow controller configured to control an amount of the gas fed from the second nozzle, wherein
the amount of the gas fed from the first nozzle is larger than the amount of the gas fed from the second nozzle.

19. The extreme ultraviolet chamber apparatus according to claim 15, wherein
the first direction is toward a first region including a part of the line, and the second focal point being located on a side opposite to the EUV condensing mirror with respect to the first focal point, the first region being located closer to the EUV condensing mirror than the first focal point.

20. A method for manufacturing an electronic device comprising:
irradiating a target with a pulse laser beam to generate extreme ultraviolet light in an extreme ultraviolet light generation system including a chamber, a target supply unit configured to output the target toward a predetermined region in the chamber, a laser device configured to irradiate the target with the pulse laser beam to turn the target into plasma, an EUV condensing mirror arranged in the chamber, a first nozzle arranged in an outer peripheral portion of the EUV condensing mirror and configured to feed a gas in a first direction along a reflective surface of the EUV condensing mirror, a second nozzle arranged in the outer peripheral portion of the EUV condensing mirror and configured to feed a gas in a second direction away from the EUV condensing mirror, an exhaust port arranged in the chamber, and a third nozzle arranged between the first nozzle and the second nozzle, the EUV condensing mirror having a spheroidal reflective surface, the third nozzle being arranged in the outer peripheral portion of the EUV condensing mirror and feeding a gas in a third direction, the third direction being along a plane perpendicular to a line passing through a first focal point and a second focal point of the spheroidal reflective surface and being toward the line;

outputting the extreme ultraviolet light to an exposure device; and exposing a photosensitive substrate to the extreme ultraviolet light in the exposure device to manufacture an electronic device.

* * * * *